(12) United States Patent
Park

(10) Patent No.: US 8,035,137 B2
(45) Date of Patent: Oct. 11, 2011

(54) MOLECULAR ELECTRONIC DEVICE HAVING A PATTERNED ELECTRODE AND METHOD OF FABRICATING THE SAME

(75) Inventor: Dae-Sik Park, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 235 days.

(21) Appl. No.: 12/341,812

(22) Filed: Dec. 22, 2008

(65) Prior Publication Data

US 2009/0101955 A1    Apr. 23, 2009

(30) Foreign Application Priority Data

Jun. 30, 2008   (KR) .................. 10-2008-0063154

(51) Int. Cl.
*G01N 27/327* (2006.01)
(52) U.S. Cl. .................. 257/253; 204/403.04
(58) Field of Classification Search ............ 204/403.04, 204/403.11; 257/253
See application file for complete search history.

(56) References Cited

U.S. PATENT DOCUMENTS 7,087,148 B1 * 8/2006 Blackburn et al. ............ 205/452
2002/0123048 A1 * 9/2002 Gau .................................. 435/6

FOREIGN PATENT DOCUMENTS

KR   10-2006-0129884   12/2006
KR   10-2008-0032119   4/2008

OTHER PUBLICATIONS

Korean Office Action for 10-20080063154, citing the above reference(s).

* cited by examiner

*Primary Examiner* — Thomas L Dickey
(74) *Attorney, Agent, or Firm* — Lowe Hauptman Ham & Berner LLP

(57) ABSTRACT

A molecular electronic device, and a method of fabricating the same, includes a first electrode having a plurality of prominences and depressions on which a plurality of molecules are self-assembled. Capacitance of a molecular electronic device used as a capacitor is increased by forming prominences and depressions on the surface of the first electrode thereby enabling more molecules to be self-assembled on the surface of the lower electrode.

16 Claims, 3 Drawing Sheets

MOLECULAR ELECTRONIC DEVICE HAVING A PATTERNED ELECTRODE AND METHOD OF FABRICATING THE SAME

CROSS-REFERENCE TO RELATED APPLICATION

The present application claims priority of Korean patent application number 10-2008-0063154, filed on Jun. 30, 2008, which is incorporated herein by reference in its entirety.

BACKGROUND

The disclosure relates to a molecular electronic device and a method of fabricating the same, and more particularly, to a molecular electronic device for storing data using redox property of molecular and a method of fabricating the same.

A dynamic random access memory (DRAM) has been commercialized as a memory device. The DRAM includes unit cells each including one capacitor and one transistor. When a voltage is applied to a gate of the transistor or each unit cell of the DRAM, a channel is formed between a source terminal and a drain terminal by controlling a channel width under the gate according to the voltage applied to the gate and stored data is identified '1' or '0' by reading the charge state of the capacitor connected to the source terminal, in which electrons are charged or discharged according to the data.

As the memory device is highly integrated, it is difficult to secure the capacitance of the capacitor in the DRAM device and to design a structure with required capacitance.

In order to overcome such a problem, a molecular electronic device has been used as a capacitor instead of a conventional capacitor having dielectric between an upper electrode and a lower electrode.

The molecular electronic device includes an upper electrode, a lower electrode, a thin film made of self-assembled molecules over the lower electrode, and an electrolyte between the upper electrode and the lower electrode. The molecular electronic device stores electric charge using the redox property of each molecule. One molecule includes various redox potentials. The more redox potentials are included in the molecule, the more electric charges can be stored in the molecular electronic device. Therefore, it is possible to increase capacitance significantly by using the molecular electronic device, compared with a conventional capacitor. Such capacitance increment reduces the limitation of a memory device in size and structure. Accordingly, a method of fabricating a memory device using the molecular electronic device may be easier and simpler than that of fabricating a memory device using the conventional capacitor.

There is demand for developing a technology to increase capacitance more when the molecular electronic device is used as a capacitor.

SUMMARY

One or more embodiments provide a molecular electronic device and a fabricating method thereof for improving a device property such as capacitance by increasing a surface area of a lower electrode through forming prominence and depression on the surface of the lower electrode in order to enable more molecules self-assembled on the surface of the lower electrode.

In accordance with one or more embodiments, a molecular electronic device includes a first electrode having a plurality of molecules self-assembled on a surface of the first electrode, wherein the surface of the first electrode has prominences and depressions.

In accordance with one or more embodiments, a method of fabricating a molecular electronic device includes forming a first electrode on a substrate, forming prominences and depressions on a surface of the first electrode, and forming a plurality of molecules on the surface of the first electrode using a self-assembling method.

In accordance with one or more embodiments, a memory device includes a transistor having source and drain regions; and a capacitor connected to the source or drain regions of the transistor, wherein the capacitor includes a first electrode having prominences and depressions on a surface of the first electrode; a plurality of molecules self-assembled over the surface; an electrolyte layer over the first electrode; and a second electrode over the electrolyte layer, wherein each of the plurality of molecules includes a tether connected to the surface of the first electrode, and a redox active unit reacting with the electrolyte layer to be oxidized or deoxidized.

DESCRIPTION OF EMBODIMENTS

Figure 1:
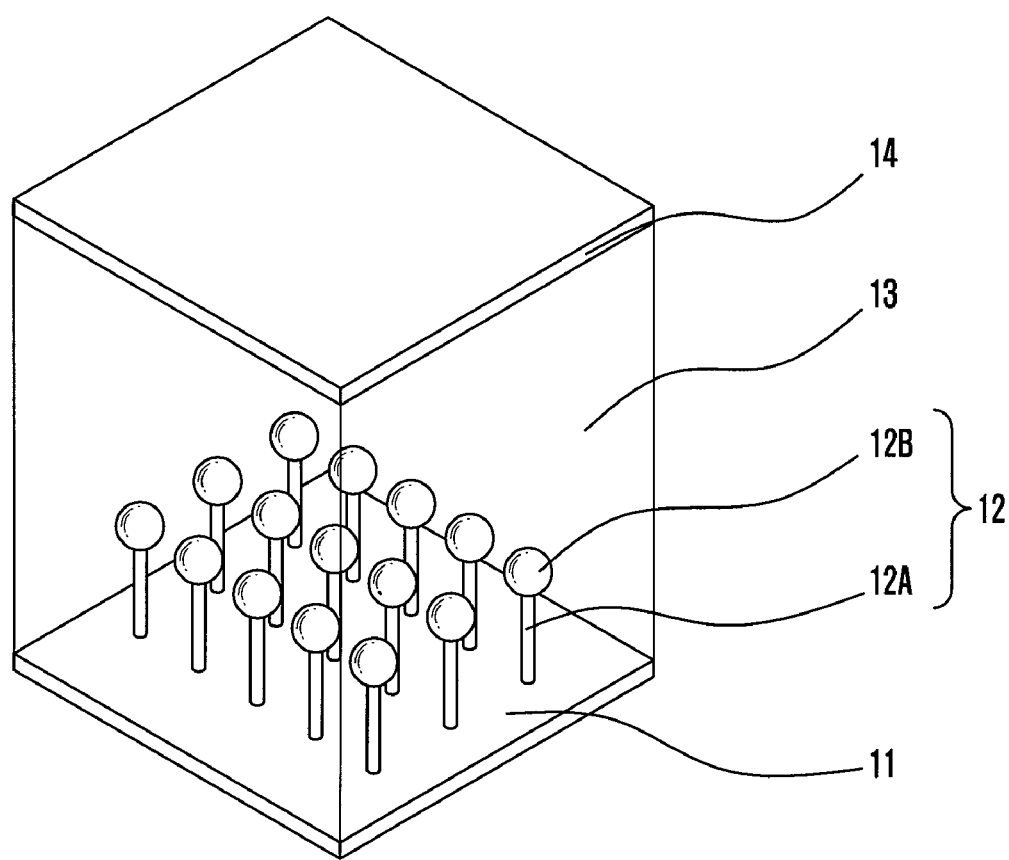
FIG. 1 is a diagram illustrating a molecular electronic device in accordance with one or more embodiments.

Other objects and advantages of one or more embodiments can be understood by the following description, and become apparent with reference to one or more embodiments. In the drawings, the same or like reference numerals represent the same or like elements throughout the drawings.

FIG. 1 is a diagram illustrating a molecular electronic device in accordance with an embodiment. A method of fabricating a molecular electronic device according to the present embodiment will be described with reference to FIG. 1.

First, a structure of the molecular electronic device according to the present embodiment will be described.

As shown in FIG. 1, the molecular electronic device includes a lower electrode 11 having a plurality of self-assembled molecules 12, an electrolyte layer 13 over the lower electrode 11, and an upper electrode 14 over the electrolyte layer 13.

The lower electrode 11 and the upper electrode 14 may be made of gold (Au) or silver (Ag).

Each of the self-assembled molecules 12 includes a tether 12A and a redox active unit 12B for self-assembling. The tether 12A includes elements that are bonded to material of the lower electrode 11. For example, in case of the lower electrode 11 being made of gold or silver, it is preferable to use a tether 12A including thiol at a bottom thereof. In case of a thin film (not shown) of an oxide-based material being on the lower electrode 11, it is preferable to use a tether 12A having silane at a bottom thereof to form O—H bonding with the oxide thin film. The redox active unit 12B loses or obtains electrons by chemical reaction with the electrolyte layer 13. The redox active unit 12B is made of porphyrin-based molecules or ferroncene-based molecules.

The amount of molecules 12 self-assembled on the lower electrode 11 is determined according to the surface area of the lower electrode 11.

In order to store more data, it has been required to integrate more molecules on the same area of the molecular electronic device. In case of using a molecular electronic device in a memory device, for example, instead of a capacitor in a DRAM, it is possible to increase capacitance by integrating as many molecules on a lower electrode as possible. Hereinafter, a method of increasing a surface area of a lower electrode in order to increase the amount of molecules self-assembled on the lower electrode will be described with reference to FIGS. 2A and 2B.

Figure 2A:
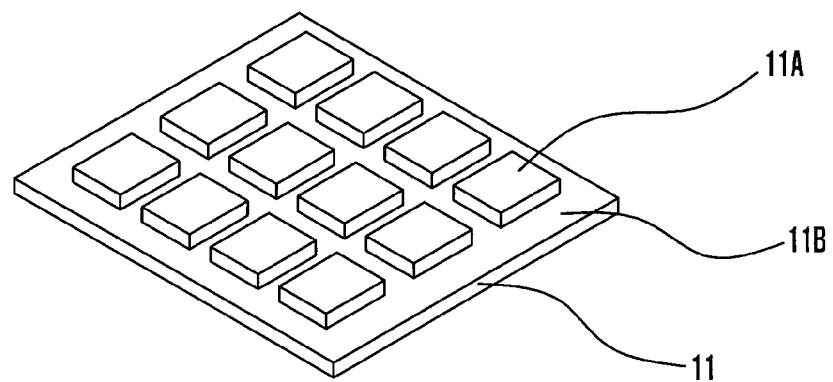
FIGS. 2A and 2B are diagrams illustrating a low electrode of a molecular electronic device in accordance with one or more embodiments.
Figure 2B:
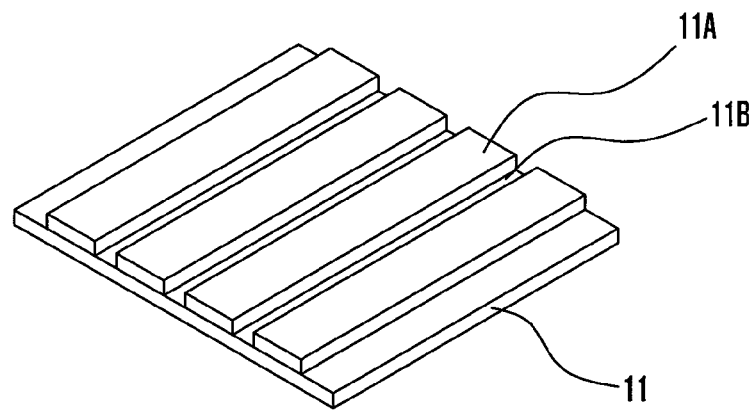

FIGS. 2A and 2B are diagrams illustrating a low electrode of a molecular electronic device in accordance with one or more embodiments.

As shown in FIGS. 2A and 2B, the lower electrode of the molecular electronic device according to the present embodiment includes a prominence 11A and a depression 11B on a surface thereof. It is preferable to form a plurality of prominences 11A and depressions 11B on the surface of the lower electrode. As shown in FIG. 2A, each of the prominences 11A may be isolated in a form of an island and surrounded by the depressions 11B. As shown in FIG. 2B, each of the prominences 11A and the depressions 11B may be formed in a shape of a line and alternately disposed. However, the present invention is not limited thereto. The prominences 11A and the depressions 11B are not limited in the number, the location, or the shape.

By forming the prominences and the depressions on the surface of the lower electrode, the surface area of the lower electrode increases, thereby increasing the amount of molecules self-assembled on the lower electrode.

Hereinafter, a method of fabricating a molecular electronic device according to one or more embodiments will be described.

As shown in FIG. 1, a lower electrode 11 is formed over a substrate (not shown). For example, a conductive layer for a lower electrode may be deposited and patterned for forming the lower electrode 11. Here, the conductive layer may be made of gold or silver.

Then, prominences 11A and depressions 11B are formed on the surface of the lower electrode 11 as shown in FIGS. 2A and 2B. Here, a patterning process may be performed for forming the prominences 11A and the depressions 11B on the surface of the lower electrode 11.

Then, a self-assembled molecule layer is formed over the lower electrode 11 having the prominences 11A and the depressions 11B on the surface thereof. The self-assembled molecule layer is a layer made of a plurality of self-assembled molecules 12. That is, the plurality of molecules 12 may be self-assembled on the surface of the lower electrode 11 by digesting a substrate structure having the lower electrode 11 in a solvent with the molecules melted therein. In case of the lower electrode 11 being made of silver or gold as described above, molecules 12 including a tether 12A having thiol can be self-assembled on the lower electrode 11. When a thin film made of an oxide-based material over the lower electrode 11 is deposited regardless of the material of the lower electrode 11, molecules 12 including tethers 12A having silane can be self-assembled on the thin film.

Then, an electrolyte layer 13 is formed by injecting an electrolyte on the lower electrode 11 having the self-assembled molecules 12. Since the molecular electronic device is generally included in a solid state architecture, it is preferable that the electrolyte layer 13 is either a solid state or a gel state.

After forming the electrolyte layer 13, an upper electrode 14 is formed by depositing and patterning a conductive layer for the upper electrode on the electrolyte layer 13. For example, the upper electrode 14 is made of gold or silver.

Hereinafter, the operation of the molecular electronic device according to one or more embodiments will be described.

When a predetermined voltage is applied between the lower electrode 11 and the upper electrode 14, the redox active units 12B of the molecules 12 chemically react with the electrolyte layer 13. Metal atoms in the redox active units 12B are oxidized or deoxidized by losing or gaining electrons according to voltage variation.

As described above, in case of using the molecular electronic device for a memory device instead of a capacitor of a DRAM, electric charges are stored in the molecular electronic device when the metal atoms of the redox active units 12B are oxidized. On the contrary, the stored electric charges are discharged from the molecular electronic device when the metal atoms of the redox active units 12B are deoxidized. That is, the molecular electronic device can store data, for example, bit data of '0' or '1', by storing electric charges and discharging the stored electric charges. In case of using the molecular electronic device instead of the capacitor, the capacitance can be increased as the amount of self-assembled molecules 12 gets increased.

However, the molecular electronic device according to the present embodiment is not limited to the memory device. For example, the molecular electronic device according to one or more embodiments can be used for a switch for switching an on-state and an off-state. One or more embodiments can be used for all kinds of molecular electronic devices in order to increase the amount of self-assembled molecules.

Figure 3A:
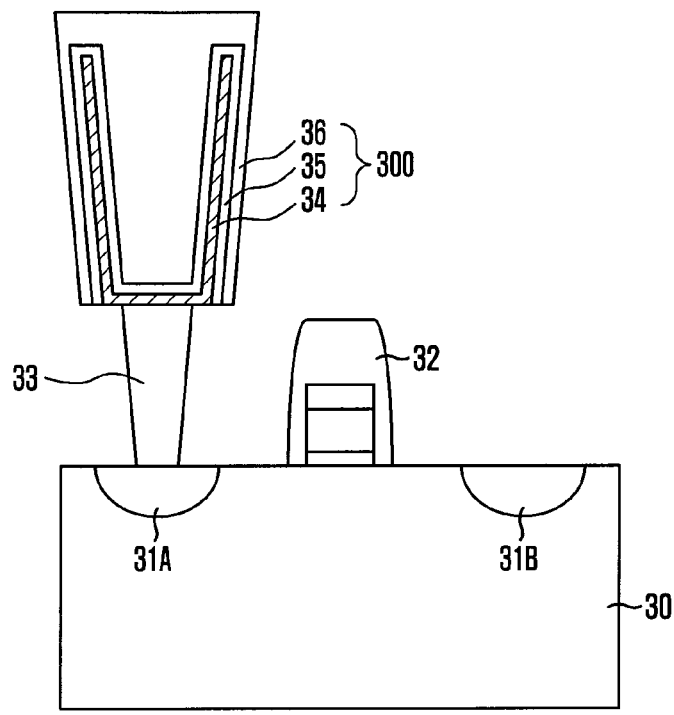
FIGS. 3A and 3B are cross-sectional views illustrating a DRAM according to the related art in comparison with a memory having a molecular electronic device according to one or more embodiments.
Figure 3B:
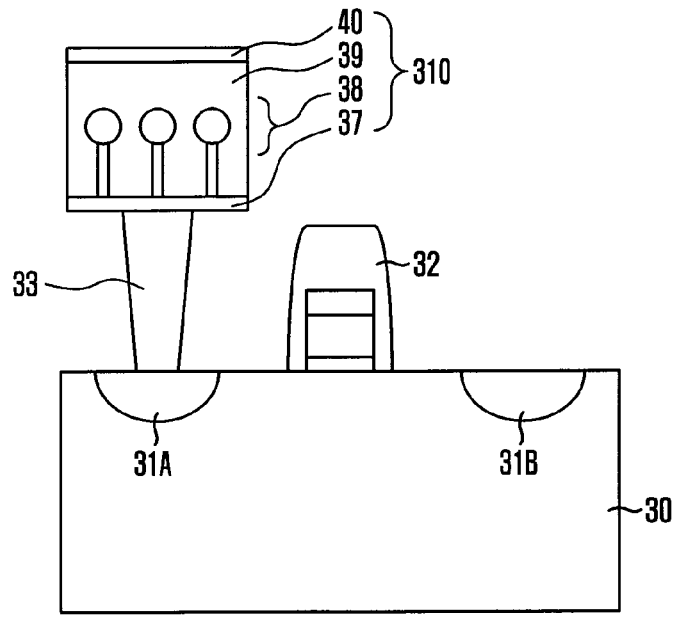

FIGS. 3A and 3B are cross-sectional views illustrating a DRAM according to the related art in comparison with a memory having a molecular electronic device according to one or more embodiments.

Referring to FIG. 3A, the DRAM according to the related art includes a unit cell including a transistor and a capacitor. In more detail, The DRAM according to the related art includes a transistor and a capacitor 300. The transistor includes source and drain regions 31A and 31B formed in the semiconductor substrate 30 at a predetermined gap and a gate pattern 32 between the source and drain regions 31A and 31B on the semiconductor substrate 30. The capacitor 300 is connected to one of the source and drain regions 31A and 31B through a contact 33. The capacitor 300 has a stack structure of a lower electrode 34, a dielectric layer 35, and an upper electrode 36. As shown, the height of the capacitor 300 is very high in order to secure the capacitance, and the lower electrode 34 is formed in a cylinder type.

Referring to FIG. 3B, the memory device according to the present embodiment has the same structure compared with the DRAM of FIG. 3A except the molecular electric device used instead of the capacitor 300. That is, the memory device according to the present embodiment includes a transistor and a molecular electronic device 310. The transistor includes source and drain regions 31A and 31B formed in the semiconductor substrate 30 at a predetermined gap and a gate pattern 32 formed between the source and drain regions 31A and 31B on the semiconductor substrate 30. The molecular electronic device 310 is connected to one of the source and drain regions 31A and 31B through a contact 33. The molecular electronic device 310 includes a lower electrode 37, a plurality of self-assembled molecules 38 formed on the lower electrode 37, an electrolyte layer 39, and an upper electrode 40. Here, the lower electrode 37 includes prominences and depressions on a surface thereof, as described above referring FIGS. 2A and 2B. Since the capacitance is decided by the amount of the self-assembled molecules 38 on the lower electrode 37 and the prominences and depressions on the lower electrode 37 provide enough surface area to obtain required capacitance, the molecular electronic device 310 need not to be as high as the conventional capacitor or to have a complex structure such as a cylinder type. Therefore, the fabricating process becomes simple.

One or more embodiments provide a molecular electronic device and a method of fabricating the same, with improved properties of the molecular electronic device. That is, one or more embodiments achieve increased capacitance by increasing a surface area of a lower electrode through forming prominences and depressions on the surface of the lower electrode thereby enabling more molecules to be self-assembled on the surface of the lower electrode.

While one or more embodiments have been described, it will be apparent to those skilled in the art that various changes and modifications may be made.

What is claimed is:

1. A molecular electronic device, comprising:
a first electrode having a surface that includes prominences and depressions;
a plurality of molecules self-assembled on the surface of the first electrode; and
a thin film of an oxide-based material formed over the first electrode;
wherein the plurality of molecules are self-assembled on the thin film.

2. The molecular electronic device of claim 1, wherein the prominences are formed in an island shape surrounded by the depressions, or the prominences and the depressions are formed in a line shape alternating each other.

3. The molecular electronic device of claim 1, further comprising:
a second electrode over the first electrode; and
an electrolyte layer interposed between the first electrode and the second electrode,
wherein each of the plurality of molecules includes a tether connected on the surface of the first electrode and a redox active unit for reacting with the electrolyte layer to be oxidized or deoxidized.

4. The molecular electronic device of claim 3, wherein the first electrode is made of gold or silver, and the tether includes thiol.

5. The molecular electronic device of claim 3, wherein the redox active unit is made of porphyrin-based molecules or ferrocene-based molecules.

6. The molecular electronic device of claim 3, wherein electric charges are stored or discharged by oxidization or deoxidization of the redox active unit according to a voltage applied between the first electrode and the second electrode.

7. The molecular electronic device of claim 6, wherein data is stored by storing or discharging the electric charges.

8. The molecular electronic device of claim 1, further comprising:
a second electrode on the first electrode; and
an electrolyte layer interposed between the first electrode and the second electrode,
wherein each of the plurality of molecules includes a tether connected to a surface of the thin film, and a redox active unit for reacting with the electrolyte layer to be oxidized or deoxidized.

9. The molecular electronic device of claim 8, wherein the tether include silane.

10. A memory device, comprising:
a transistor having source and drain regions; and
a capacitor connected to the source or drain regions of the transistor;
wherein the capacitor includes:
a first electrode having prominences and depressions on a surface of the first electrode;
a plurality of molecules self-assembled over the surface;
an electrolyte layer over the first electrode;
a second electrode over the electrolyte layer, and
an oxide thin film formed over the first electrode;
wherein each of the plurality of molecules includes a tether connected to the surface of the first electrode, and a redox active unit for reacting with the electrolyte layer to be oxidized or deoxidized.

11. The memory device of claim 10, wherein data is stored by storing or discharging electric charges through oxidization and deoxidization of the redox active unit according to a voltage applied between the first electrode and the second electrode.

12. The memory device of claim 10, wherein the prominences are formed in an island shape surrounded by the depressions, or the prominences and the depressions are formed in a line shape alternating each other.

13. A method of fabricating a molecular electronic device, comprising: forming a first electrode on a substrate; forming prominences and depressions on a surface of the first electrode; and forming a plurality of molecules on the surface of the first electrode using a self-assembling method, further comprising:
forming a thin film of an oxide-based material over the first electrode after forming the prominences and the depressions on the surface of the first electrode,
wherein the plurality of molecules are formed on a surface of the thin film by the self-assembling method.

14. The method of claim 13, wherein forming the prominences and the depressions on the surface of the first electrode is performed by a patterning process.

15. The method of claim 13, further comprising:
forming an electrolyte layer over the first electrode after forming the plurality of molecules on the surface of the first electrode using the self-assembling method; and
forming a second electrode over the electrolyte layer.

16. The method of claim 13, wherein forming the prominences and the depressions on the surface of the first electrode forms the prominences in an island shape surrounded by the depressions or forms the prominences and the depressions in a line shape alternating each other.

* * * * *